US012740114B2

(12) United States Patent
Kim

(10) Patent No.: US 12,740,114 B2
(45) Date of Patent: Sep. 15, 2026

(54) SEMICONDUCTOR SWITCHING DEVICES WITH ENHANCED PERFORMANCE USING 2-DIMENSIONAL MATERIALS

(71) Applicant: Samsung Electronics Co., Ltd., Suwon-si (KR)

(72) Inventor: Kijoon Kim, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 748 days.

(21) Appl. No.: 18/148,657

(22) Filed: Dec. 30, 2022

(65) Prior Publication Data

US 2023/0299141 A1 Sep. 21, 2023

(30) Foreign Application Priority Data

Mar. 18, 2022 (KR) ........................ 10-2022-0033913

(51) Int. Cl.

*H10D 62/17* (2025.01)
*H10D 62/13* (2025.01)
*H10D 62/80* (2025.01)

(52) U.S. Cl.

CPC ......... *H10D 62/235* (2025.01); *H10D 62/151* (2025.01); *H10D 62/80* (2025.01)

(58) Field of Classification Search

CPC .. H10D 62/883; H10D 62/80; H10D 30/6219; H10D 30/6729; H10D 64/62; H10D 30/675; H10D 62/235; H10D 62/151; H10D 30/014; H10D 62/221

See application file for complete search history.

(56) References Cited

U.S. PATENT DOCUMENTS 9,147,824 B1 * 9/2015 Cao ........................ H10D 99/00
9,935,184 B2 4/2018 Byun et al.
10,361,313 B2 7/2019 Youn et al.
10,672,894 B2 6/2020 Van Houdt et al.
10,741,646 B2 8/2020 Yeh et al.
11,121,214 B2 9/2021 Lin et al.
11,581,430 B2 2/2023 Pritchard et al.
(Continued)

FOREIGN PATENT DOCUMENTS

CN 109900750 A 6/2019
CN 112635594 A 4/2021
(Continued)

OTHER PUBLICATIONS

"Office Action with Search Report", TW Application No. 112101149, Sep. 7, 2023, 8 pp.

*Primary Examiner* — Wasiul Haider
(74) *Attorney, Agent, or Firm* — Wolf, Greenfield & Sacks, P.C.

(57) ABSTRACT

A semiconductor device includes a semiconductor channel region on a substrate, and a contact layer that contacts a first side of the channel region. The channel region may include a transition metal dichalcogenide (TMD) monolayer as a semiconductor layer. The contact layer includes a first transition metal and a first chalcogen element bonded to the first transition metal. A gate structure is provided on the channel region, and a source/drain layer is provided that contacts the contact layer. The source/drain layer includes a metal that forms a covalent bond with the first transition metal within the contact layer.

10 Claims, 18 Drawing Sheets

(56) References Cited

U.S. PATENT DOCUMENTS

| | | | | |
|---|---|---|---|---|
| 2016/0181516 | A1 | 6/2016 | Reed et al. | |
| 2018/0151763 | A1 | 5/2018 | Heo et al. | |
| 2021/0057524 | A1 * | 2/2021 | Lin | H10D 62/118 |
| 2021/0296445 | A1 * | 9/2021 | Lee | H10D 64/512 |

FOREIGN PATENT DOCUMENTS

| | | | |
|---|---|---|---|
| CN | 113421915 | A | 9/2021 |
| JP | 2017-079313 | A | 4/2017 |
| KR | 101708751 | B1 | 2/2017 |
| KR | 102316181 | B1 | 10/2021 |
| TW | 201714297 | A | 4/2017 |
| TW | 202109882 | A | 3/2021 |
| TW | 202111958 | A | 3/2021 |

* cited by examiner

SEMICONDUCTOR SWITCHING DEVICES WITH ENHANCED PERFORMANCE USING 2-DIMENSIONAL MATERIALS

REFERENCE TO PRIORITY APPLICATION

This application claims priority under 35 USC § 119 to Korean Patent Application No. 10-2022-0033913, filed Mar. 18, 2022, the disclosure of which is hereby incorporated herein by reference.

TECHNICAL FIELD

Embodiments of the inventive concept relate to semiconductor devices and, more particular, semiconductor switching devices including transistors.

RELATED ART

A silicon channel region is typically used in conventional semiconductor switching devices. However, as the size of the semiconductor device decreases, the electrical characteristics of the channel region including silicon may reach a theoretical limit. Thus, a channel region including a 2-dimensional material having a higher charge mobility than silicon has been developed. Unfortunately, the 2-dimensional material may have a relatively high contact resistance with conductive materials having metals therein.

SUMMARY

Example embodiments provide a semiconductor device having improved performance characteristics.

According to example embodiments, a semiconductor device is provided that includes a channel region as a semiconductor 2-dimensional material, on a substrate. A contact layer is provided that contacts a side of the channel region. The contact layer includes a metallic 2-dimensional material. A gate structure is provided on the channel region, along with a source/drain layer that includes a metal and contacts the contact layer. In some embodiments, the contact layer may include a first transition metal and a first chalcogen element bonded to the transition metal, and the first transition metal and the metal included in the source/drain layer may form a covalent bond to thereby reduce contact resistance.

According to additional embodiments, a semiconductor device is provided that includes a channel region including a semiconducting 2-dimensional material, on a substrate. A gate structure is provided on a portion of the channel region, and a contact layer is provided on a portion of the channel region and is spaced apart from the gate structure. The contact layer includes a metallic 2-dimensional material. A source/drain layer is provided that contacts the contact layer and includes a metal. The contact layer may include a first transition metal, a first chalcogen element bonded to the transition metal, and a second element bonded to the first transition metal. The second element may be different from the first chalcogen element. The second element and the metal included in the source/drain layer may form a covalent bond.

According to further embodiments, a semiconductor device is provided, which includes a channel region on a substrate. The channel region includes a semiconducting 2-dimensional material. A gate structure is provided on a portion of the channel region, and a contact layer is provided on a portion of the channel regions and is spaced apart from the gate structure. The contact layer includes a metallic 2-dimensional material. A source/drain layer is provided on, and contacts, the contact layer. The source/drain layer includes a metal. In some embodiments, the contact layer may include a material containing Mxene and one of O, F and OH bonded to the Mxene. The O, F or OH included in the contact layer and the metal included in the source/drain layer may form a covalent bond.

In still further embodiments, the contact layer including a metallic 2-dimensional material may be formed between a channel region (including a semiconducting 2-dimensional material) and a source/drain layer (including a metal). The contact layer and the source/drain layer may be bonded with each other through a covalent bond, so that a contact resistance between the channel region and the source/drain layer may decrease.

BRIEF DESCRIPTION OF THE DRAWINGS

FIG. 14 is a cross-sectional view illustrating a semiconductor device in accordance with example embodiments.

DETAILED DESCRIPTION

Example embodiments will be described in detail with reference to the accompanying drawings.

It will be understood that, although the terms “first,” “second,” and/or “third” may be used herein to describe various materials, layers, regions, pads, electrodes, patterns, structure and/or processes, these various materials, layers, regions, pads, electrodes, patterns, structure and/or processes should not be limited by these terms. These terms are only used to distinguish one material, layer, region, pad, electrode, pattern, structure or process from another material, layer, region, pad, electrode, pattern, structure or process. Thus, “first”, “second” and/or “third” may be used selectively or interchangeably for each material, layer, region, electrode, pad, pattern, structure or process respectively.

Figure 1:
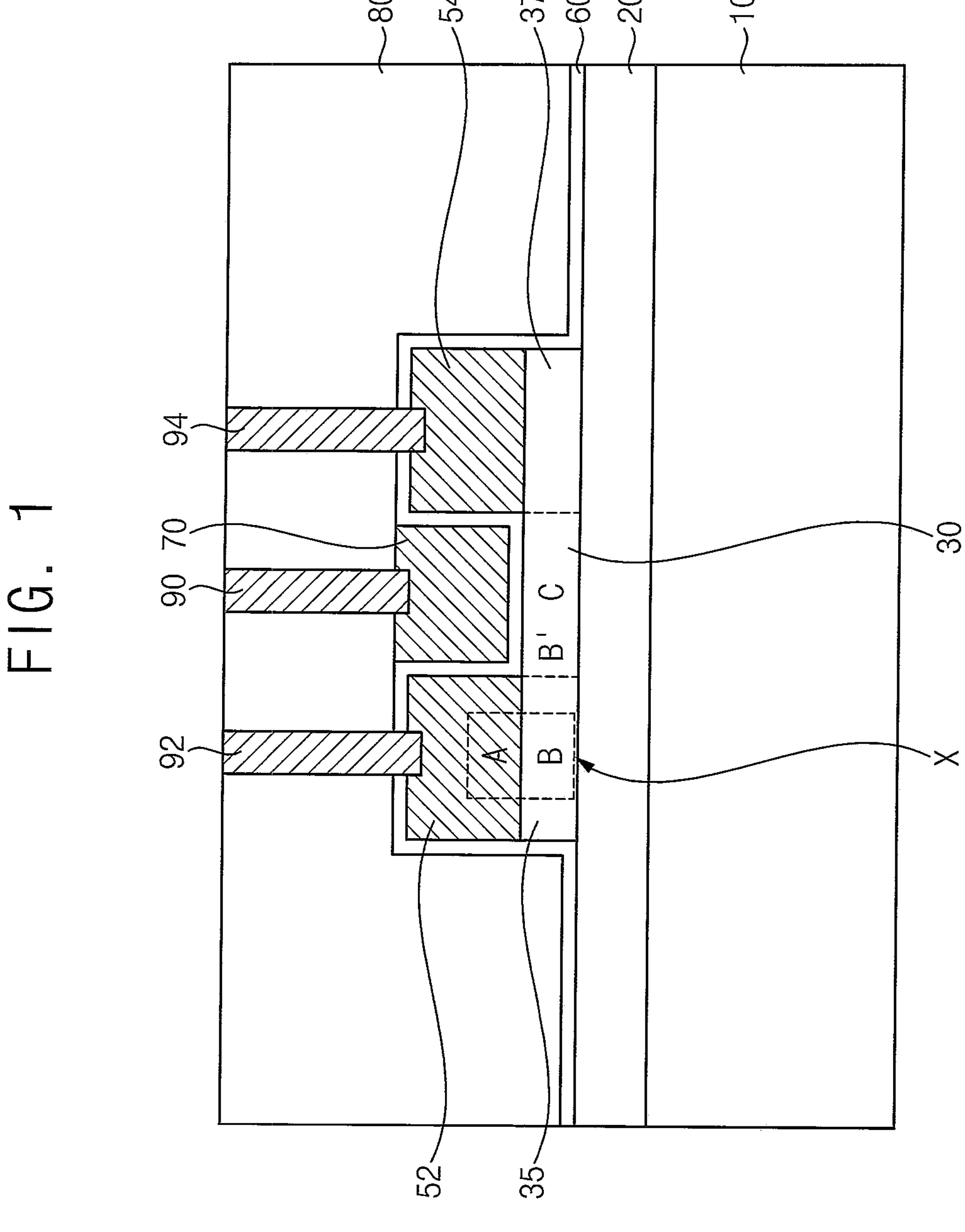
FIG. 1 is a cross-sectional view illustrating a semiconductor device in accordance with example embodiments.
Figure 2:
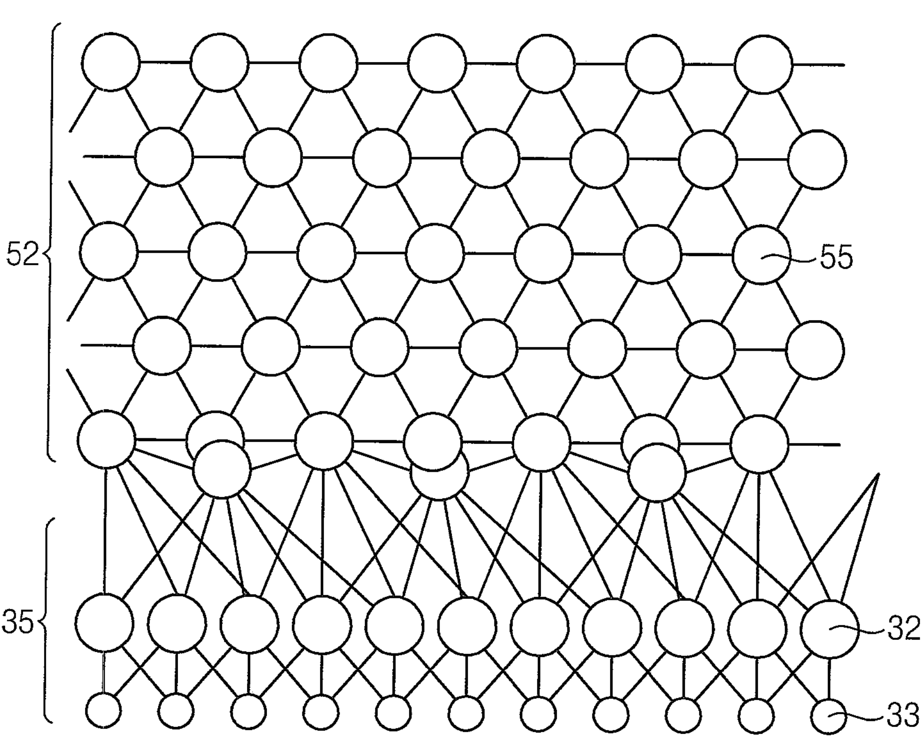
FIGS. 2 and 6 illustrate a crystalline structure of the semiconductor device in a region X of FIG. 1.
Figure 3:
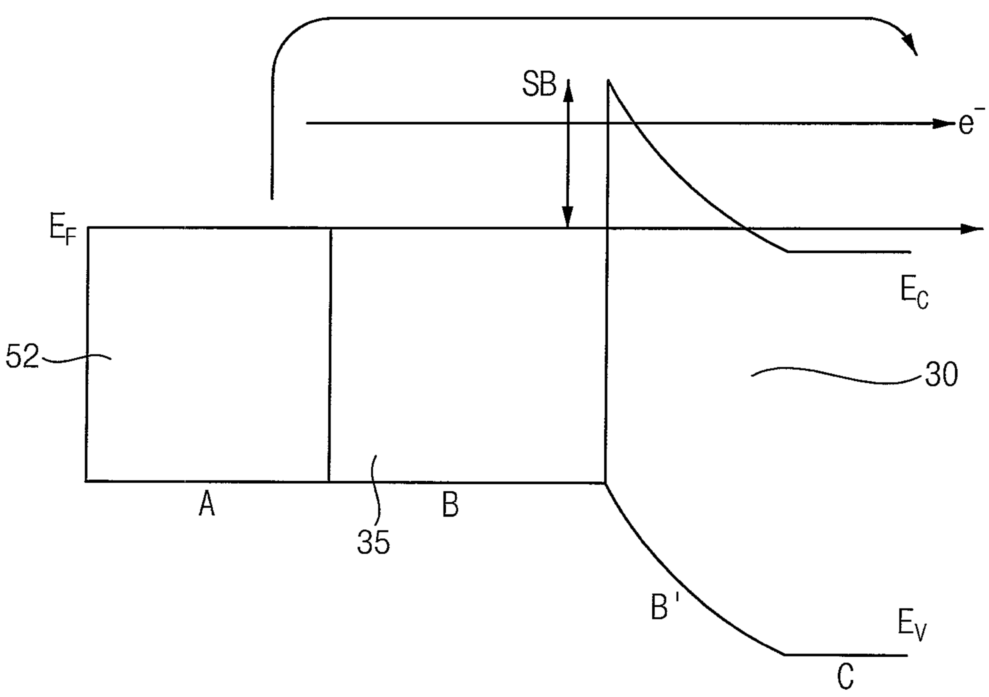
FIG. 3 is a diagram illustrating an energy band gap of the semiconductor device in the region X and a neighboring area.
Figure 6:
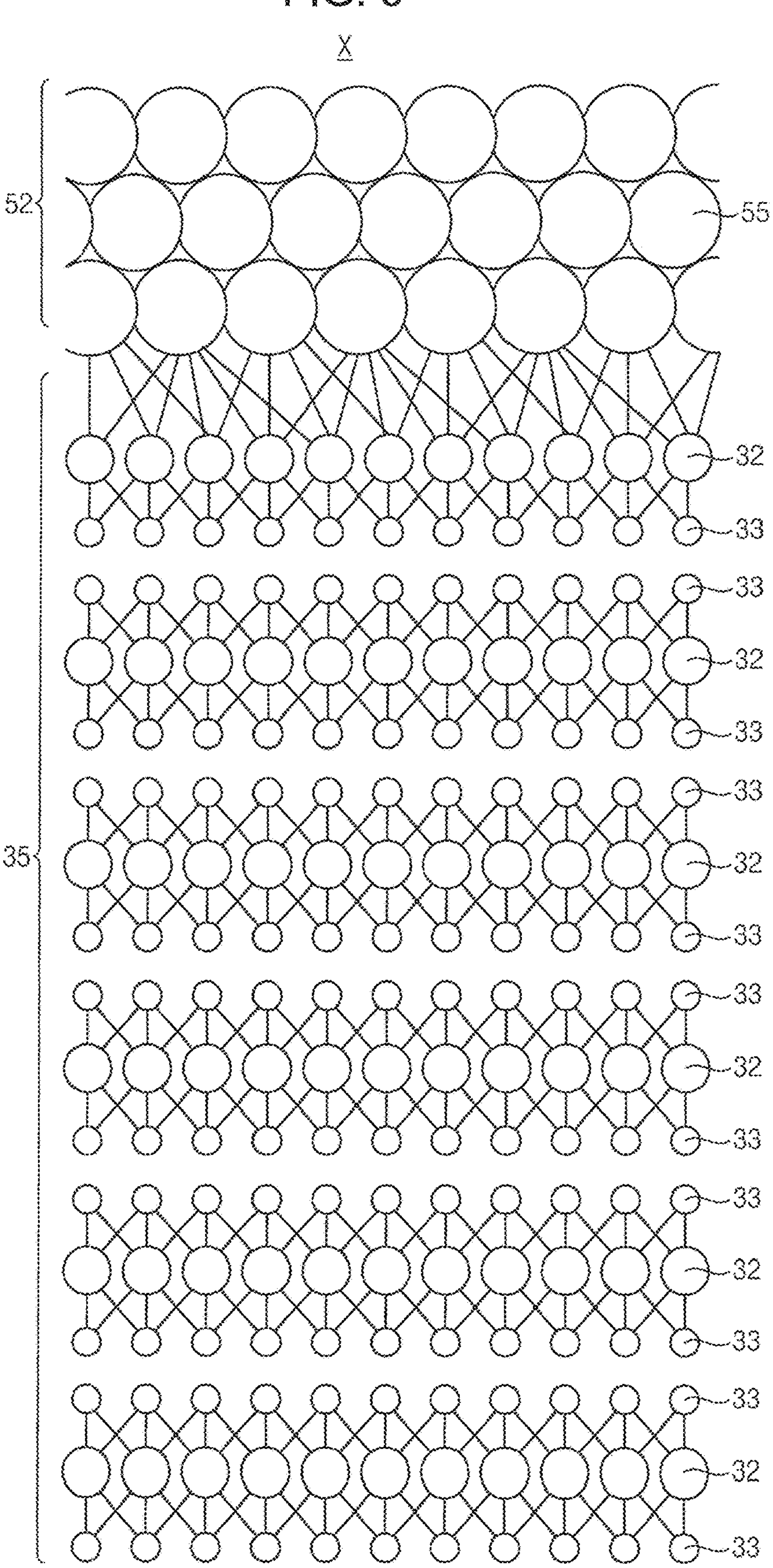

FIG. 1 is a cross-sectional view illustrating a semiconductor device in accordance with example embodiments, FIGS. 2 and 6 illustrate a crystalline structure of the semiconductor device in a region X of FIG. 1, and FIG. 3 is a diagram illustrating an energy band gap of the semiconductor device in the region X and a neighboring area.

Figure 4:
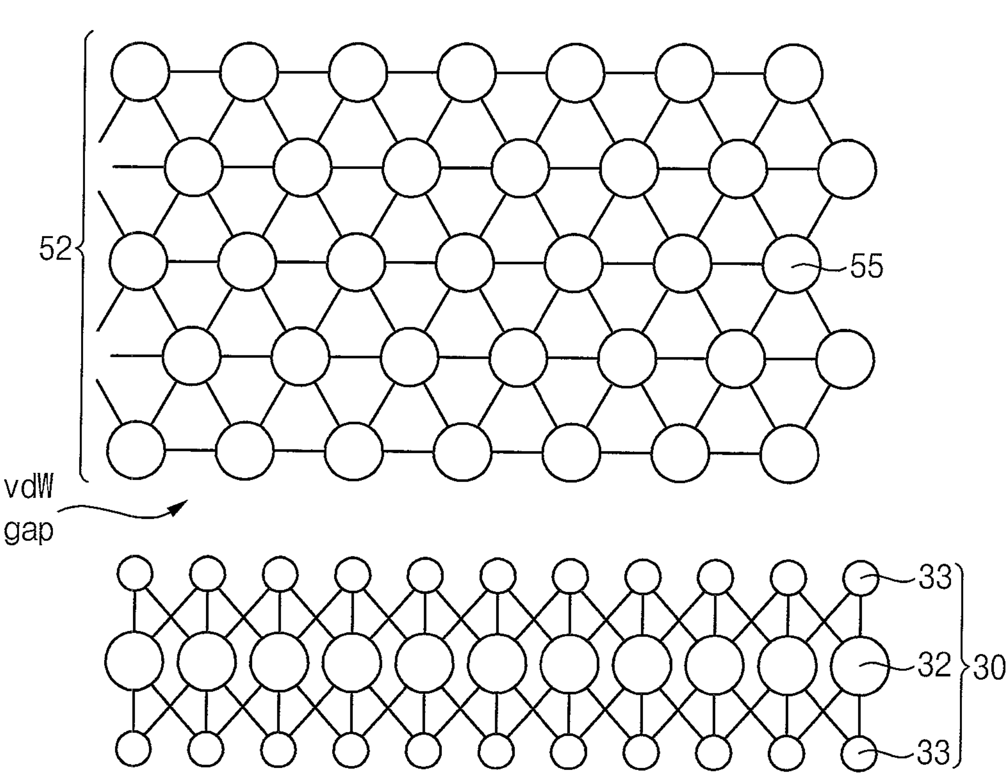
FIG. 4 illustrates a crystalline structure of a semiconductor device in accordance with a comparative embodiment in the region X of FIG. 1.
Figure 5:
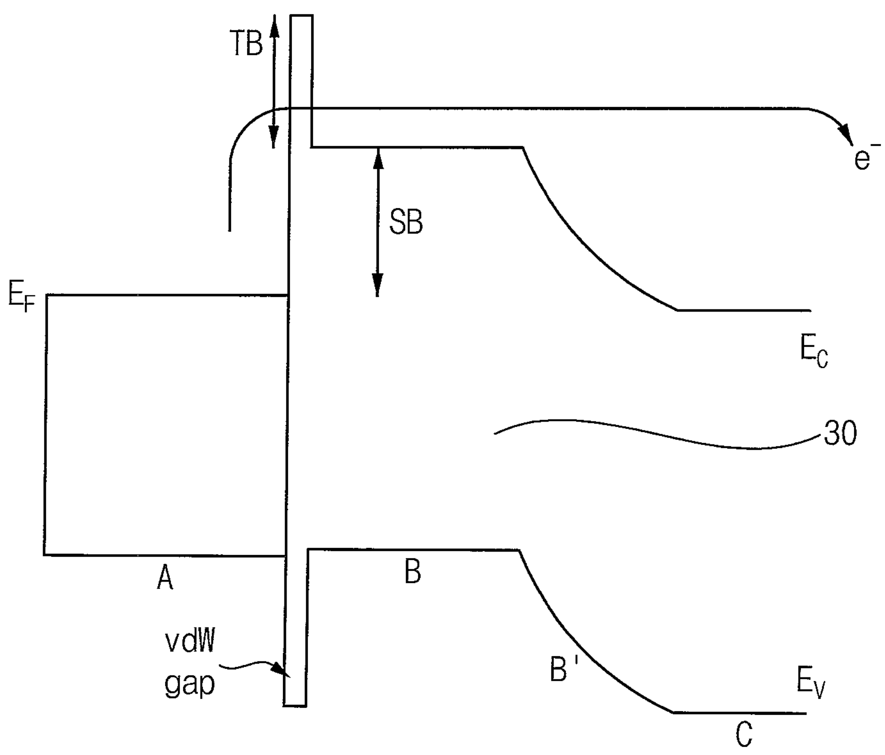
FIG. 5 is a diagram illustrating an energy band gap of the semiconductor device in the region X and a neighboring area.

FIG. 4 illustrates a crystalline structure of a semiconductor device in accordance with a comparative embodiment in the region X of FIG. 1, and FIG. 5 is a diagram illustrating an energy band gap of the semiconductor device in the region X and a neighboring area.

A, B, B' and C shown in FIGS. 3 and 5 correspond to A, B, B' and C, respectively, shown in FIG. 1.

Referring to FIG. 1, the semiconductor device may include an insulating layer 20, a channel region 30, first and second contact layers 35 and 37, first and second source/drain layers 52 and 54, a gate insulating layer 60, a gate electrode 70, an insulating interlayer 80, and first to third contact plugs 90, 92, and 94 on a substrate 10.

The gate electrode 70 and the gate insulating layer 60 may form a gate structure, and the gate structure, the channel region 30, the first and second contact layers 35 and 37, and the first and second source/drain layers 52 and 54 may form a transistor, particularly, a planar transistor. The substrate 10 may include, for example, a semiconductor material such as silicon, germanium, or silicon-germanium. The insulating layer 20 may include, for example, an insulating material such as an oxide or a nitride. Alternatively, the semiconductor device may include only an insulating substrate including an insulating material without the substrate 10.

The channel region 30 may be formed on the insulating layer 20, and may include a 2-dimensional material. In an example embodiment, the channel region 30 may include a transition metal dichalcogenide (TMD) containing a transition metal and a chalcogen element. That is, the channel region 30 may include a material represented by a chemical formula $MX_2$ (M: transition metal, X: chalcogen element), and may include, for example, a first transition metal 32 and first chalcogen elements 33 bonded to upper and lower portions, respectively, of the first transition metal 32.

The transition metal may include, for example, molybdenum (Mo), tungsten (W), rhenium (Re), technetium (Tc), niobium (Nb), tantalum (Ta), hafnium (Hf), zirconium (Zr), osmium (Os), ruthenium (Ru), iridium (Ir), rhodium (Rh), platinum (Pt), palladium (Pd), Yittrium (Y), Lanthanum (La), Lutetium (Lu), scandium (Sc), titanium (Ti), vanadium (V), chrome (Cr), Manganese (Mn), iron (Fe), cobalt (Co), nickel (Ni), or the like, and the chalcogen element may include, for example, sulfur (S), selenium (Se), tellurium (Te), or the like. Thus, the channel region 30 may include, for example, molybdenum disulfide ($MoS_2$), molybdenum diselenide ($MoSe_2$), molybdenum ditelluride ($MoTe_2$), tungsten disulfide ($WS_2$), tungsten diselenide ($WSe_2$), tungsten ditelluride ($WTe_2$), or the like. Alternatively, the channel region 30 may include graphene or black phosphorus, according to further embodiments of the invention.

The first and second contact layers 35 and 37 may be formed on the insulating layer 20. Particularly, the first and second contact layers 35 and 37 may be formed at opposite sides of the channel region 30, and may contact the first and second source/drain layers 52 and 54, respectively.

Each of the first and second source/drain layers 52 and 54 may include a metal. Particularly, each of the first and second source/drain layers 52 and 54 may include a metal, e.g., titanium, tantalum, tungsten, copper, aluminum, or the like, or a metal silicide, e.g., titanium nitride, tantalum nitride, tungsten nitride, or the like.

In some embodiments, each of the first and second contact layers 35 and 37 may include a metallic 2-dimensional material. In an example embodiment, each of the first and second contact layers 35 and 37 may include a material that may be formed by removing a chalcogen element adjacent to a corresponding one of the first and second source/drain layers 52 and 54, that is, a chalcogen element bonded to the upper portion of the transition metal from TMD. That is, each of the first and second contact layers 35 and 37 may include a material in which one of two X's bonded to M in a material represented by (M: transition metal, X: chalcogen element) is removed.

Thus, each of the first and second contact layers 35 and 37 may include a material in which a chalcogen element, e.g., sulfur (S), selenium (Se) or tellurium (Te) is removed from TMD (e.g., molybdenum disulfide ($MoS_2$), molybdenum diselenide ($MoSe_2$), molybdenum ditelluride ($MoTe_2$), tungsten disulfide ($WS_2$), tungsten diselenide ($WSe_2$), tungsten ditelluride ($WTe_2$), or the like).

Referring to FIG. 2, in example embodiments, the material included in each of the first and second contact layers 35 and 37 and a metal included in the corresponding one of the first and second source/drain layers 52 and 54 may form a covalent bond, and thus the first and second contact layers 35 and 37 may be strongly bonded with the first and second source/drain layers 52 and 54, respectively.

Particularly, each of the first and second contact layers 35 and 37, like the channel region 30, may initially include the first transition metal 32 and the first chalcogen elements 33 bonded to upper and lower portions, respectively, of the first transition metal 32. However, the first chalcogen element 33 that is bonded to the upper portion of the first transition metal 32 may be removed from each of the first and second contact layers 35 and 37, so that the first transition metal 32 included in each of the first and second contact layers 35 and 37 and a metal 55 included in the corresponding one of the first and second source/drain layers 52 and 54 may form a covalent bond.

Thus, unlike the channel region 30 including a semiconducting 2-dimensional material, each of the first and second contact layers 35 and 37 at a corresponding one of opposite sides of the channel region 50 may include a metallic 2-dimensional material.

Referring to FIG. 4, in the semiconductor device in accordance with the comparative embodiment, only the channel region 30 may be formed, and the first and second contact layers 35 and 37 may not be formed. Thus, the first and second source/drain layers 52 and 54 including a metal may directly contact the channel region 30 instead of the first and second contact layers 35 and 37. That is, the channel region 30 may include the first transition metal 32 and the first chalcogen elements 33 bonded to the upper and lower portions, respectively, of the first transition metal 32, and a van der Waals gap (vdW gap) may be formed between the first chalcogen element 33 bonded to the upper portion of the first transition metal 32 and the metal 55 included in each of the first and second source/drain layers 52 and 54.

Referring to FIG. 5, in the semiconductor device in accordance with the comparative embodiment, a tunnel barrier (TB) may be further formed between each of the first and second source/drain layers 52 and 54 including a metal and the channel region 30 including TMD in addition to Schottky barrier (SB), and thus charges may not easily move from the metal included in each of the first and second source/drain layers 52 and 54 to the channel region 30. Additionally, Fermi level pinning effect may occur at an interface between each of the first and second source/drain layers 52 and 54 and the channel region 30. Thus, a contact resistance between each of the first and second source/drain layers 52 and 54 and the channel region 30 may have a relatively large value.

Referring to FIG. 3, in the semiconductor device in accordance with example embodiments, the first transition metal 32 of the material included in each of the first and second contact layers 35 and 37 from which an upper one of the first chalcogen elements 33 is removed and the metal 55 included in the corresponding one of the first and second source/drain layers 52 and 54 may form a covalent bond, and the tunnel barrier (TB) according to the van der Waals gap (vdW gap) may be avoided, so that charges may more easily move from the metal included in the first and second source/drain layers 52 and 54 to the first and second contact layers 35 and 37, respectively. Thus, advantageously, a contact resistance between each of the first and second source/drain layers 52 and 54 and the corresponding one of the first and second contact layers 35 and 37 may have a relatively small value.

Referring to FIG. 6, each of the first and second contact layers 35 and 37 may have a multi-layered structure in which TMD layers are stacked in a vertical direction by a van der Waals force, however, as illustrated with reference to FIG. 2, one of the first chalcogen elements 33 bonded to an upper portion of the first transition metal 32 is removed from an uppermost one of the TMD layers.

Thus, the first transition metal 32 of the uppermost one of the TMD layers included in each of the first and second contact layers 35 and 37 and the metal 55 included in the corresponding one of the first and second source/drain layers 52 and 54 may form a covalent bond, and the contact resistance between each of the first and second source/drain layers 52 and 54 and the corresponding one of the first and second contact layers 35 and 37 may have a relatively small value.

Likewise, the channel region 30 may also have a multi-layered structure, and in some embodiments, instead of the entire parts of each of the first and second contact layers 35 and 37, only the uppermost one of the TMD layers forming the covalent bond with the corresponding one of the first and second source/drain layers 52 and 54 may be defined as each of the first and second contact layers 35 and 37, and other underlying parts of each of the first and second contact layers 35 and 37 may be defined as a portion of the channel region 30. In this case, the first and second contact layers 35 and 37 may not be formed at opposite sides, respectively, of the channel region 30, but may be formed on edge portions, respectively, of the channel region 30.

In each of the first and second contact layers 35 and 37, the transition metal 32 and the first chalcogen element 33 included in the uppermost one of the TMD layers may be substantially the same as or different from the transition metal 32 and the first chalcogen element 33, respectively, included in other underlying ones of the TMD layers.

Referring to FIG. 1 again, the gate insulating layer 60 may be formed on an upper surface of the channel region 30, sidewalls and upper surfaces of the first and second source/drain layers 52 and 54, a sidewall of each of the first and second contact layers 35 and 37, and an upper surface of the insulating layer 20. The gate insulating layer 60 may include, for example, silicon oxide, a metal oxide, or the like. The gate electrode 70 may be formed on a portion of the gate insulating layer 60 on the upper surface of the channel region 30, and a lower surface and a sidewall of the gate electrode 70 may be covered by the gate insulating layer 60.

The gate electrode 70 may include, for example, a metal, a metal nitride, a metal silicide, polysilicon doped with impurities, or the like.

The insulating interlayer 80 may be formed on the insulating layer 20, and may cover the gate insulating layer 60 and the gate electrode 70. The insulating interlayer 80 may include, for example, an oxide such as silicon oxide, a nitride such as silicon nitride, or a low-dielectric material. As shown by FIG. 1, the first contact plug 90 may extend through the insulating interlayer 80, and may contact an upper surface of the gate electrode 70. The second and third contact plugs 92 and 94 may extend through the insulating interlayer 80 and the gate insulating layer 60, and may contact upper surfaces of the first and second source/drain layers 52 and 54, respectively. Each of the first to third contact plugs 90, 92, and 94 may include, for example, a metal, a metal nitride, a metal silicide, or the like.

As illustrated above, in the semiconductor device in accordance with example embodiments, the first and second contact layers 35 and 37 including a metallic 2-dimensional material, e.g., a TMD material from which an upper one of the first chalcogen elements 33 is removed may be formed at opposite sides of the channel region 30 to contact the first and second source/drain layers 52 and 54, respectively. The first transistor metal 32 included in each of the first and second contact layers 35 and 37 and the metal 55 included in the corresponding one of the first and second source/drain layers 52 and 54 may form a covalent bond so that charges may easily move therebetween. Accordingly, the contact resistance between each of the first and second source/drain layers 52 and 54 and the corresponding one of the first and second contact layers 35 and 37 may have a relatively small value.

Figure 7:
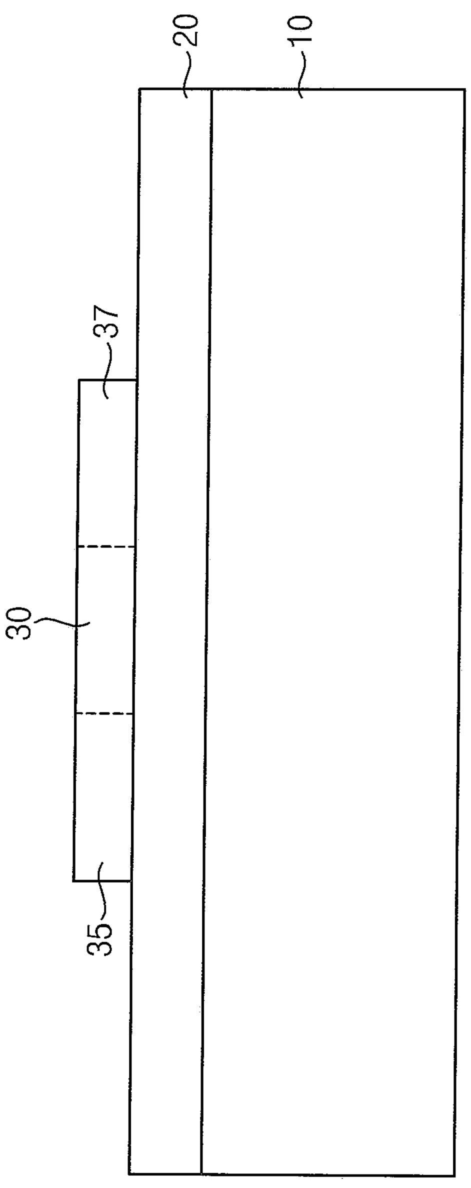
FIGS. 7 to 9 are cross-sectional views illustrating a method of manufacturing a semiconductor device in accordance with example embodiments.
Figure 8:
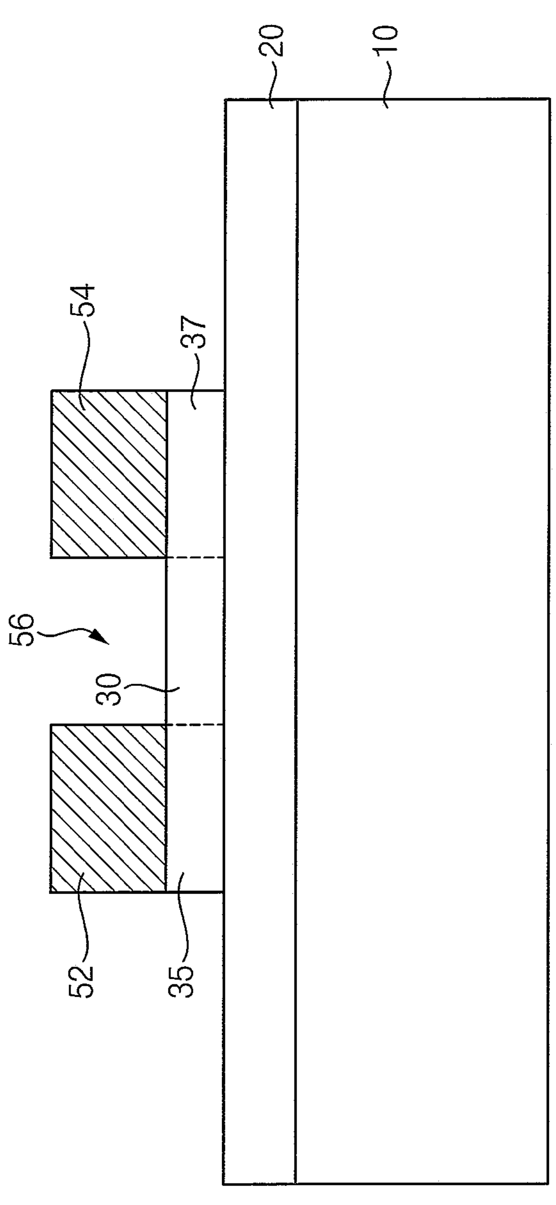
Figure 9:
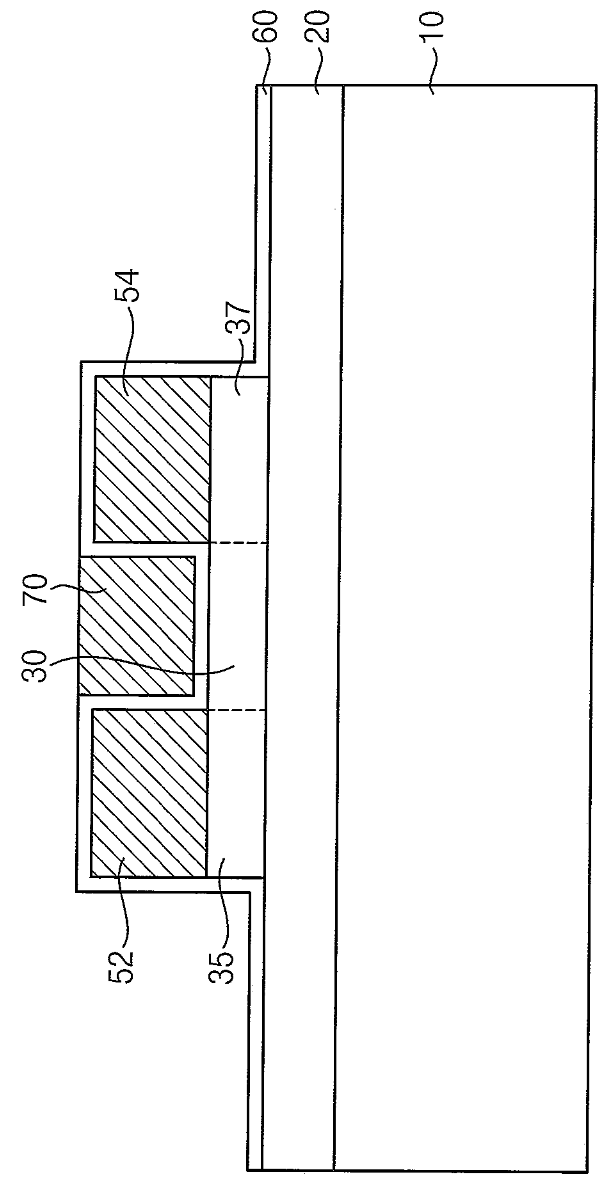

FIGS. 7 to 9 are cross-sectional views illustrating a method of manufacturing a semiconductor device in accordance with example embodiments. Referring to FIG. 7, the insulating layer 20 may be formed on the substrate 10, the semiconductor channel region 30 may be formed on the insulating layer 20, and edge portions of the channel region 30 may be converted into first and second contact layers 35 and 37, respectively. In example embodiments, the channel region 30 may be formed on the insulating layer 20 by a chemical vapor deposition (CVD) process, and may include a semiconducting 2-dimensional material.

In other example embodiments, the first and second contact layers 35 and 37 may be formed by disposing a mask on a central upper surface of the channel region 30 and heating the substrate 10 with, e.g., H-plasma, F-plasma, He+ ions, laser, or the like, to remove an upper chalcogen element of the semiconducting 2-dimensional material included in each of the edge portions of the channel region 30.

If the channel region 30 includes, e.g., molybdenum disulfide ($MoS_2$), the substrate 10 may be heated to, e.g., a temperature of about 350° C. to about 450° C. If the channel region 30 includes, e.g., molybdenum diselenide ($MoSe_2$), the substrate 10 may be heated to, e.g., a temperature of about 750° C. to about 850° C.

In an example embodiment, if the first and second contact layers 35 and 37 are formed by providing laser onto the substrate 10, one or ones of $H_2$, $H_2S$, $H_2Se$ and $PH_3$ may also be used.

By the above processes, the upper one of the chalcogen elements bonded to the transition metal in the TMD at the opposite edge portions of the channel region 30 may be removed to temporarily form a dangling bond to form the first and second contact layers 35 and 37, respectively, including a 2-dimensional material having a dangling bond. A central portion of the channel region 30 may remain as the channel region 30 including a semiconducting 2-dimensional material. The mask may then be removed.

Referring to FIG. 8, a preliminary source/drain layer may be formed by, e.g., a deposition process on the insulating layer 20 on which the channel region 30 and the first and second contact layers 35 and 37 are formed, an etching mask may be formed on the preliminary source/drain layer, and the preliminary source/drain layer may be etched using the etching mask to form the first and second source/drain layers 52 and 54 on the first and second contact layers 35 and 37, respectively.

During the deposition process, a metal included in the preliminary source/drain layer and the transition metal included in each of the first and second contact layers 35 and 37 may form a covalent bond via the dangling bond generated in the 2-dimensional material of each of the first and second contact layers 35 and 37. An opening 56 may then be formed to expose an upper surface of the channel region 30 between the first and second source/drain layers 52 and 54.

Referring to FIG. 9, the gate insulating layer 60 may be formed on the upper surface of the insulating layer 20, the upper surface of the channel region 30 exposed by the opening 56, the sidewalls of the first and second contact layers 35 and 37, and the sidewalls and upper surfaces of the first and second source/drain layers 52 and 54, and the gate electrode 70 may be formed on the gate insulating layer 60 to fill a remaining portion of the opening 56.

Referring to FIG. 1 again, the insulating interlayer 80 may be formed on the insulating layer 20 to cover the gate electrode 70 and the gate insulating layer 60, the first contact plug 90 may be formed through the insulating interlayer 80 to contact an upper surface of the gate electrode 70, and the second and third contact plugs 92 and 94 may be formed through the insulating interlayer 80 and the gate insulating layer 60 to contact upper surfaces of the first and second source/drain layers 52 and 54, respectively. The manufacturing of the semiconductor device may be completed by the processes described above.

Figure 10:
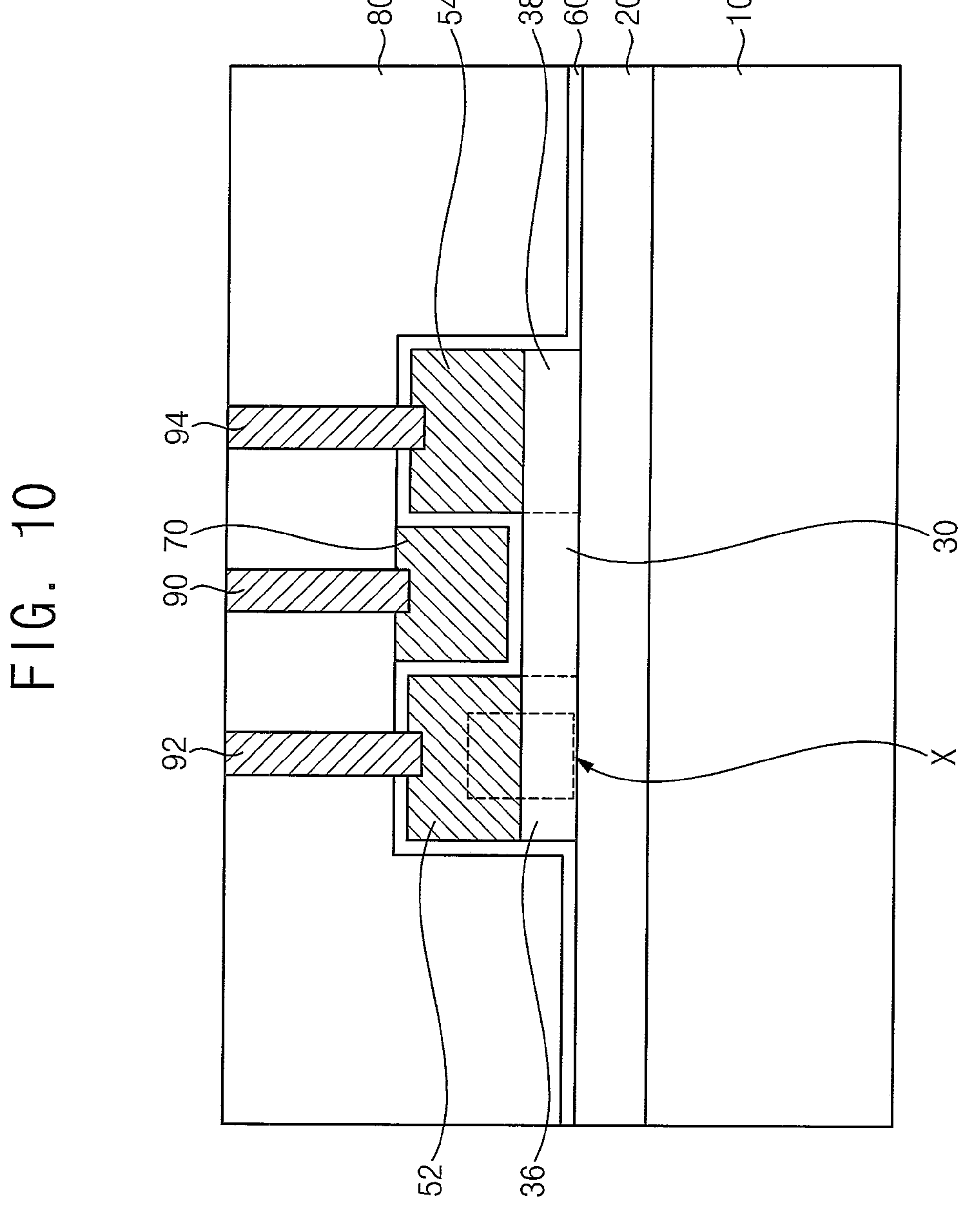
FIG. 10 is a cross-sectional view illustrating a semiconductor device in accordance with example embodiments.
Figure 11:
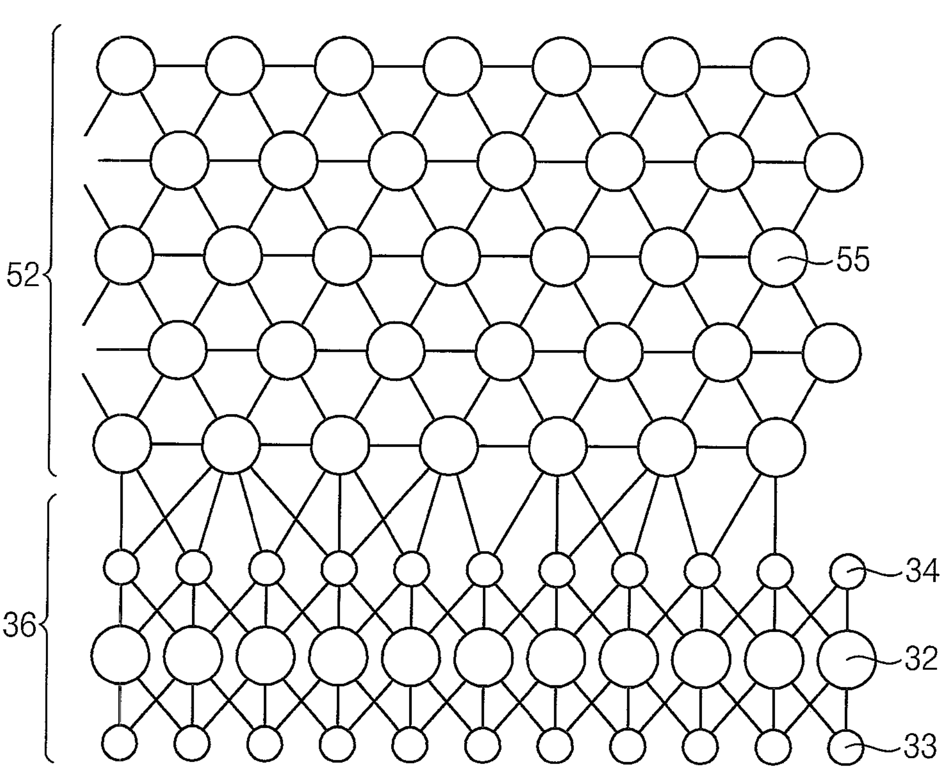
FIG. 11 illustrates a crystalline structure of the semiconductor device in a region X of FIG. 10.

FIG. 10 is a cross-sectional view illustrating a semiconductor device in accordance with example embodiments, and FIG. 11 illustrates a crystalline structure of the semiconductor device in a region X of FIG. 10. This semiconductor device may be substantially the same as or similar to the semiconductor device illustrated with reference to FIGS. 1 and 2, except the third and fourth contact layers 36 and 38 are included instead of the first and second contact layers 35 and 37. Accordingly, like reference numerals refer to like elements, and repeated explanations thereof are omitted herein.

Referring to FIG. 10, each of the third and fourth contact layers 36 and 38 may include Janus 2-dimensional TMD (where Janus refers to a type of nanoparticles). Particularly, each of the third and fourth contact layers 36 and 38 may include a material represented by a chemical formula MXY (M: transition metal, X, Y: different chalcogen elements).

Thus, each of the third and fourth contact layers 36 and 38 may include, e.g., MoSSe, MoSTe, MoTeSe, WSSe, WSTe, WTeSe, or the like.

Referring to FIG. 11, in example embodiments, the Janus 2-dimensional TMD included in each of the third and fourth contact layers 36 and 38 and the metal included in the corresponding one of the first and second source/drain layers 52 and 54 may form a covalent bond, and thus the third and fourth contact layers 36 and 38 and the first and second source/drain layers 52 and 54, respectively, may be strongly bonded with each other.

Particularly, each of the third and fourth contact layers 36 and 38 may include the first transition metal 32, and the first chalcogen element 33 and a second chalcogen element 34 bonded to lower and upper portions, respectively, of the first transition metal 32. The second chalcogen element 34 and the metal 55 included in each of the first and second source/drain layers 52 and 54 may form a covalent bond. Thus, unlike the channel region 30 including the semiconducting 2-dimensional material, the Janus 2-dimensional TMD included in the third and fourth contact layers 36 and 38 at opposite sides, respectively, of the channel region 30 may be metallic.

Accordingly, charges may easily move from the metal included in the first and second source/drain layers 52 and 54 to the third and fourth contact layers 36 and 38, respectively, and a contact resistance between each of the first and second source/drain layers 52 and 54 and a corresponding one of the third and fourth contact layers 36 and 38 may have a relatively small value.

The third and fourth contact layers 36 and 38 may be formed by performing processes substantially the same as or similar to those illustrated with reference to FIG. 7 so that an upper one of the first chalcogen elements 33 of the semiconducting 2-dimensional material in each of opposite edge portions of the channel region 30 may be removed to form the first and second contact layers 35 and 37 having dangling bonds, and providing a source gas for forming the second chalcogen element 34 so that the second chalcogen element 34 may be bonded to the first transition metal 32.

Figure 12:
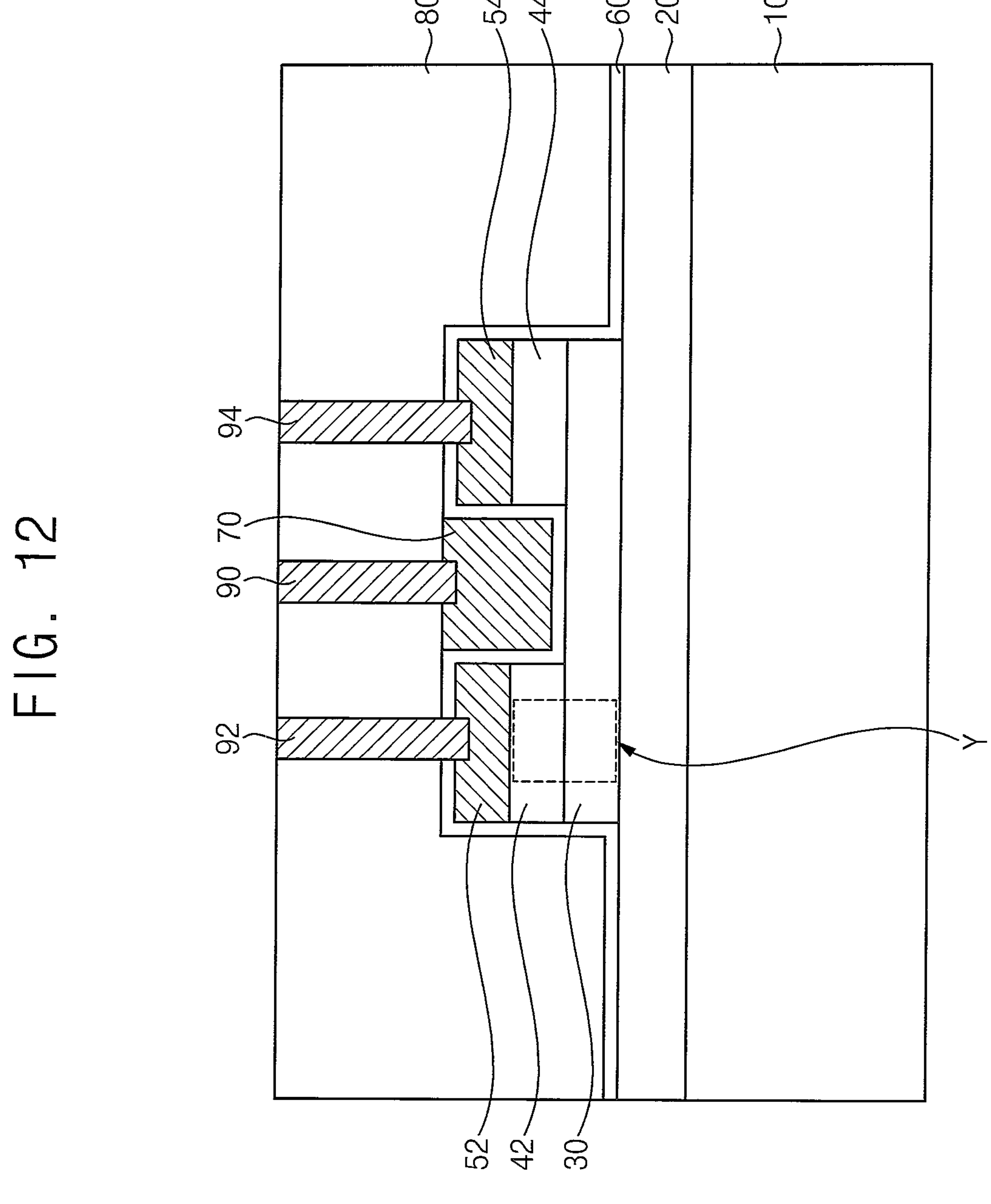
FIG. 12 is a cross-sectional view illustrating a semiconductor device in accordance with example embodiments.
Figure 13:
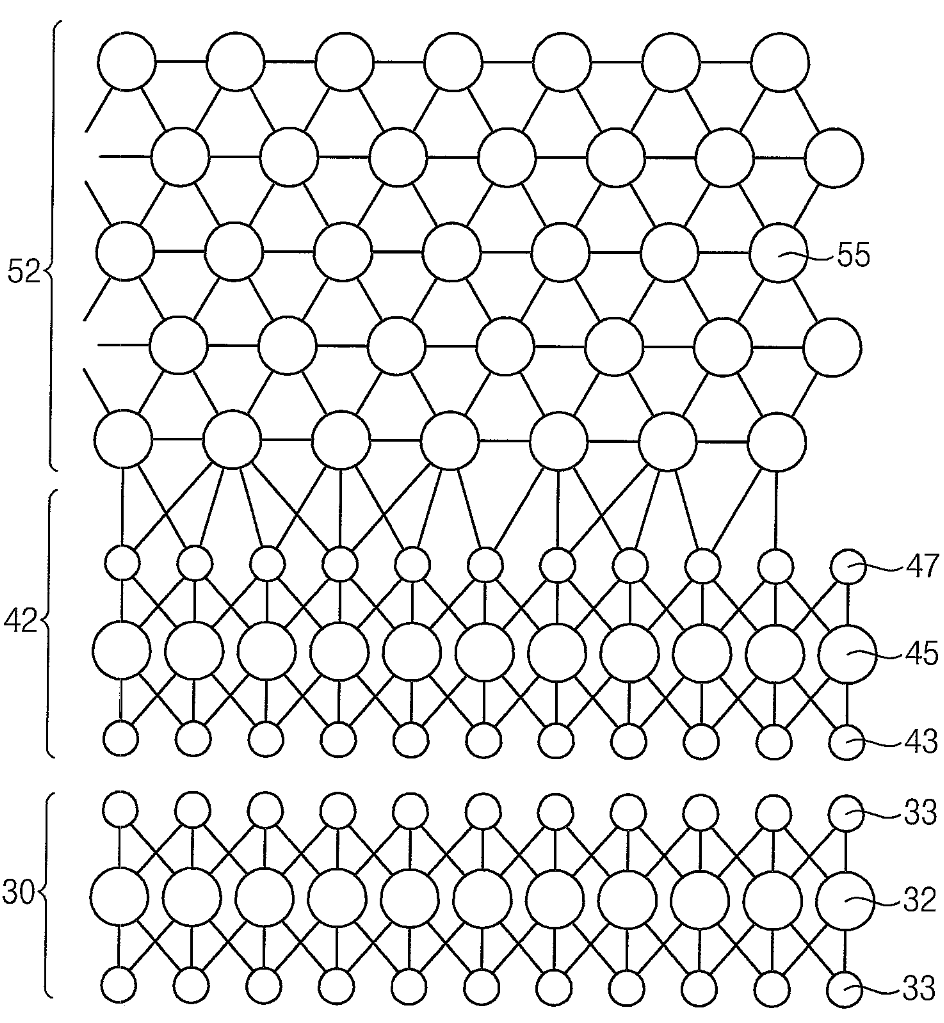
FIG. 13 illustrates a crystalline structure of the semiconductor device in a region Y of FIG. 12.

FIG. 12 is a cross-sectional view illustrating a semiconductor device in accordance with example embodiments, and FIG. 13 illustrates a crystalline structure of the semiconductor device in a region Y of FIG. 12. This semiconductor device may be substantially the same as or similar to the semiconductor device illustrated with reference to FIGS. 10 and 11, except the fifth and sixth contact layers 42 and 44 may be utilized instead of the third and fourth contact layers 36 and 38. Accordingly, like reference numerals refer to like elements, and repeated explanations thereof are omitted herein.

Referring to FIGS. 12 and 13, the fifth and sixth contact layers 42 and 44 may be formed on opposite edge portions, respectively, of the channel region 30. In an example embodiment, each of the fifth and sixth contact layers 42 and 44 may include a material represented by a chemical formula MXY (M: transition metal, X: chalcogen element, Y: oxygen), which may be metallic. That is, each of the fifth and sixth contact layers 42 and 44 may include a second transition metal 45, a third chalcogen element 43 bonded to a lower portion of the second transition metal 45, and oxygen 46 bonded to an upper portion of the second transition metal 45. Thus, each of the fifth and sixth contact layers 42 and 44 may include, e.g., OMoS, OMoTe, OMoSe, OWS, OWTe, OWSe, or the like.

In an example embodiment, each of the fifth and sixth contact layers 42 and 44 may include a material represented by a chemical formula MXY (M: transition metal, X: chalcogen element, Y: hydrogen), which may be metallic. That is, each of the fifth and sixth contact layers 42 and 44 may include the second transition metal 45, the third chalcogen element 43 bonded to a lower portion of the second transition metal 45, and hydrogen 47 bonded to an upper portion of the second transition metal 45.

Thus, each of the fifth and sixth contact layers 42 and 44 may include, e.g., HMoS, HMoTe, HMoSe, HWS, HWTe, HWSe, or the like. In addition, the hydrogen 47 included in each of the fifth and sixth contact layers 42 and 44 may be bonded with the metal 55 included in the corresponding one of the first and second source/drain layers 52 and 54.

In another example embodiment, each of the fifth and sixth contact layers 42 and 44 may include Janus 2-dimensional Mxene, which may be metallic. In particular, each of the fifth and sixth contact layers 42 and 44 may include a material that may include Mxene, which may include carbide of TMD, nitride of TMD or carbonitride of TMD, bonded with O, F, OH, or the like. Thus, each of the fifth and sixth contact layers 42 and 44 may include a material represented by a chemical formula MAX (M: transition metal, A: C, N or CN, Y: O, F or OH), e.g., $Ti_3C_2T_x$ (T: O, F or OH). And, X (O, F or OH) included in each of the fifth and sixth contact layers 42 and 44 may be bonded with the metal 55 included in the corresponding one of the first and second source/drain layers 52 and 54.

In still another example embodiment, each of the fifth and sixth contact layers 42 and 44 may include a material represented by a chemical formula MXY (M: Ti, Sn, Pt, Ga, In, Zr or HF, X, Y: H, N, Cl, Br, I, O, S, Se or Te), which may be metallic. Moreover, if M is Ti, each of X and Y may be one of Cl, Br and I, if M is Sn or Pt, each of X and Y may be one of O, S, Se and T, if M is Ga or In, each of X and Y may be one of S, Se and Te, and if M is Ti, Zr or Hf, each of X and Y is one of O, S and Se. X or Y included in each of the fifth and sixth contact layers 42 and 44 may be bonded with the metal 55 included in the corresponding one of the first and second source/drain layers 52 and 54.

In still another example embodiment, each of the fifth and sixth contact layers 42 and 44 may include metallic TMD. That is, each of the fifth and sixth contact layers 42 and 44 may include a transition metal and chalcogen elements bonded with upper and lower portions of the transition metal. For example, each of the fifth and sixth contact layers 42 and 44 may include $NbS_2$, $NbSe_2$, $NbTe_2$, $TaS_2$, $TaSe_2$, $TaTe_2$, or the like. The chalcogen elements included in each of the fifth and sixth contact layers 42 and 44 may be bonded with the metal 55 included in the corresponding one of the first and second source/drain layers 52 and 54.

As illustrated above, the fifth and sixth contact layers 42 and 44 between the channel region and the first and second source/drain layers 52 and 54, respectively, may include the metallic 2-dimensional material, and thus a contact resistance between each of the first and second source/drain layers 52 and 54 and the corresponding one of the fifth and sixth contact layers 42 and 44 may have a relatively small value.

The fifth and sixth contact layers 42 and 44 may be formed by forming a contact layer including a 2-dimensional material through, e.g., a deposition process and patterning the contact layer through an etching process using an etching mask. When the contact layer is formed, if needed, processes substantially the same as or similar to those illustrated with reference to FIG. 7, e.g., providing H-plasma, F-plasma, He+ ions or laser and heating the substrate 10 to remove one of the chalcogen elements and providing an additional source gas may be further performed.

Figure 14:
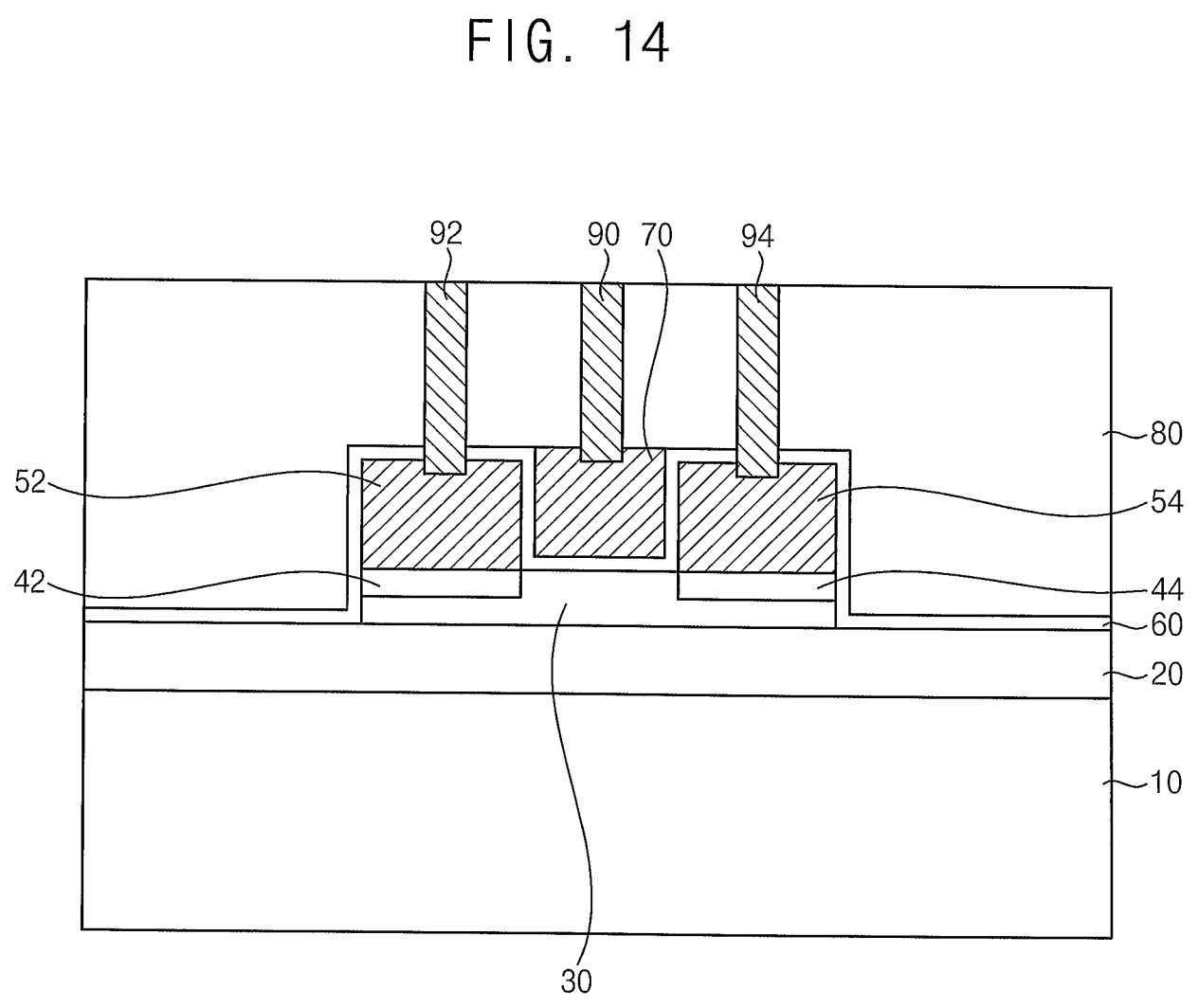

FIG. 14 is a cross-sectional view illustrating a semiconductor device in accordance with example embodiments. This semiconductor device may be substantially the same as or similar to the semiconductor device illustrated with reference to FIGS. 12 and 13, except the locations of the fifth and sixth contact layers 42 and 44. Accordingly, like reference numerals refer to like elements, and repeated explanations thereof are omitted herein.

Referring to FIG. 14, the fifth and sixth contact layers 42 and 44 may be formed on opposite edge portions, respectively, of the channel region 30, and may contact the first and second source/drain layers 52 and 54, respectively. In these example embodiments, upper surfaces of the fifth and sixth contact layers 42 and 44 may be substantially coplanar with an upper surface of the channel region 30.

The fifth and sixth contact layers 42 and 44 may be formed by forming the channel region 30, removing upper edge portions of the channel region 30 to form recesses, respectively, and forming a contact layer in each of the recesses.

Figure 15:
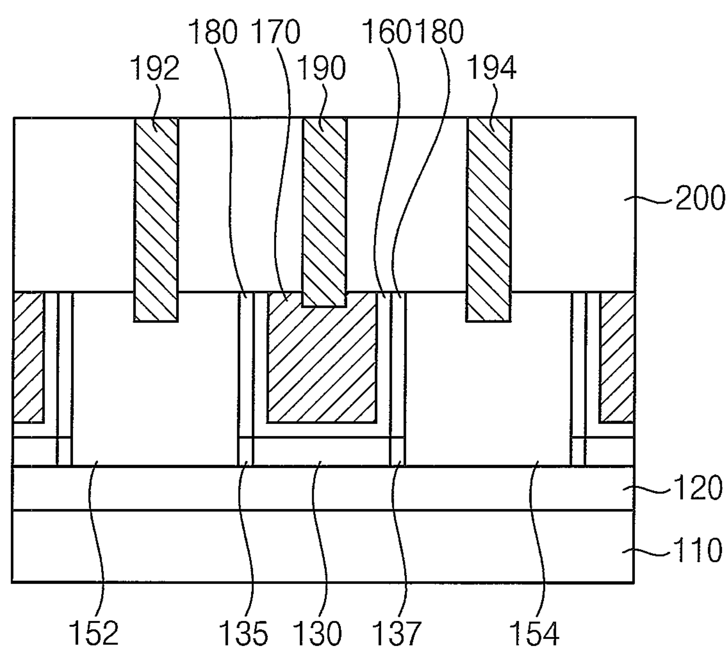
FIGS. 15 and 16 are cross-sectional views illustrating a semiconductor device in accordance with example embodiments.
Figure 16:
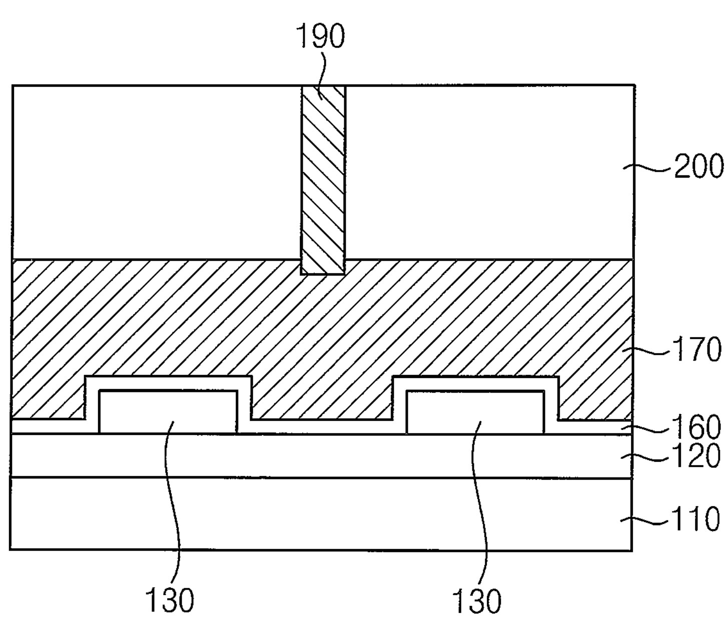

FIGS. 15 and 16 are cross-sectional views illustrating a semiconductor device in accordance with example embodiments. This semiconductor device may be an application of the planar transistor shown in FIGS. 1 and 2 to a finFET. Thus, like reference numerals refer to like elements, and repeated explanations thereof are omitted herein. This semiconductor device may also be an application of the planar transistor shown in FIGS. 10 to 14 to a finFET.

Referring to FIGS. 15 and 16, the semiconductor device may include an insulating layer 120, a channel region 130, first and second contact layers 135 and 137, first and second source/drain layers 152 and 154, a gate insulating layer 160, a gate electrode 170, a gate spacer 180, first to third contact plugs 190, 192 and 194 and an insulating interlayer 200 on a substrate 110. The gate electrode 170 and the gate insulating layer 160 may form a gate structure, and the gate structure, the channel region 130, the first and second contact layers 135 and 137, and the first and second source/drain layers 152 and 154 may form a transistor, particularly, a finFET.

In some example embodiments, the channel region 130 may protrude upwardly from the insulating layer 120, and the first and second contact layers 135 and 137 may be formed at opposite sides, respectively, of the channel region 130 in the first direction D1. In example embodiments, a plurality of channel regions 130 may be spaced apart from each other in the second direction D2, and the gate structure may extend in the second direction D2 on the insulating layer 120 and the channel region 130. Thus, the gate structure may cover and upper surface and opposite sidewalls in the second direction D2 of the channel region 130.

The gate insulating layer 160 may include a metal oxide having a high dielectric constant, e.g., hafnium oxide, zirconium oxide, or the like. The gate electrode 170 may include, e.g., a metal, a metal nitride, a metal silicide, etc. The gate spacer 180 may be formed on each of opposite sidewalls in the first direction D1 of the gate structure, and may be formed on each of the first and second contact layers 135 and 137.

The insulating interlayer 200 may be formed on the gate structure, the gate spacer 180 and the first and second source/drain layers 152 and 154, the first contact plug 190 may extend through the insulating interlayer 200 to contact the gate electrode 170, and the second and third contact plugs 192 and 194 may extend through the insulating interlayer 200 to contact the first and second source/drain layers 152 and 154, respectively.

The first and second contact layers 135 and 137 including a metallic 2-dimensional material may be formed between the channel region 130 including a semiconducting 2-dimensional material and the first and second source/drain layers 152 and 154, respectively, including a metal, and thus the contact resistance between the channel region 130 and each of the first and second source/drain layers 152 and 154 may decrease.

Figure 17:
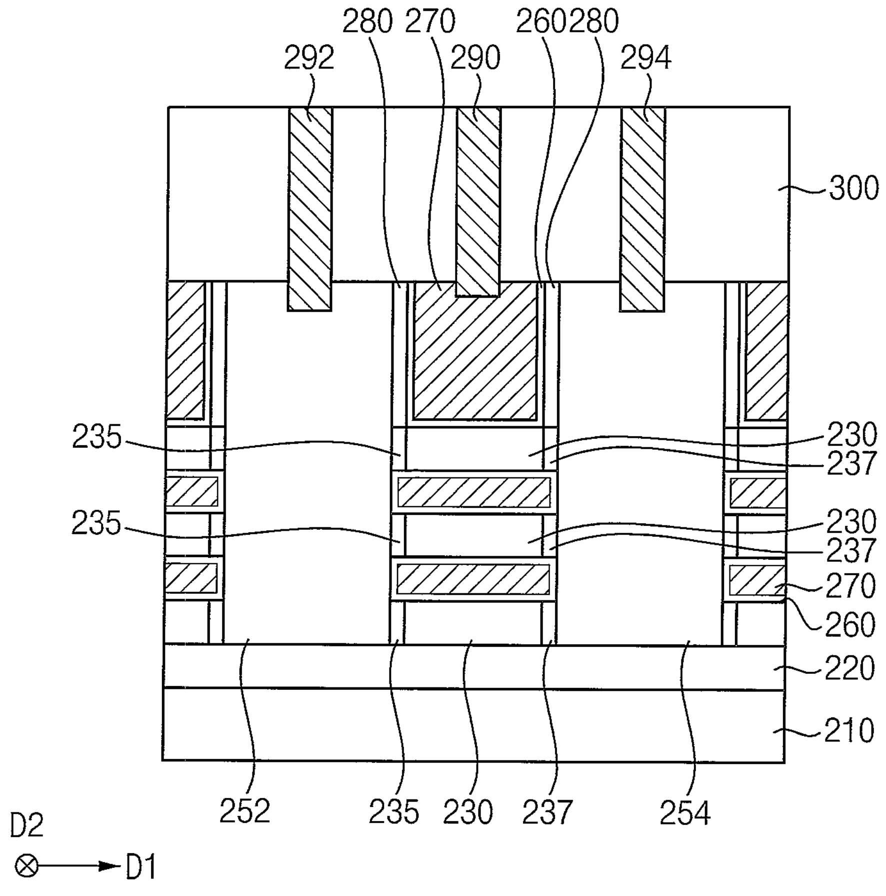
FIGS. 17 and 18 are cross-sectional views illustrating a semiconductor device in accordance with example embodiments.
Figure 18:
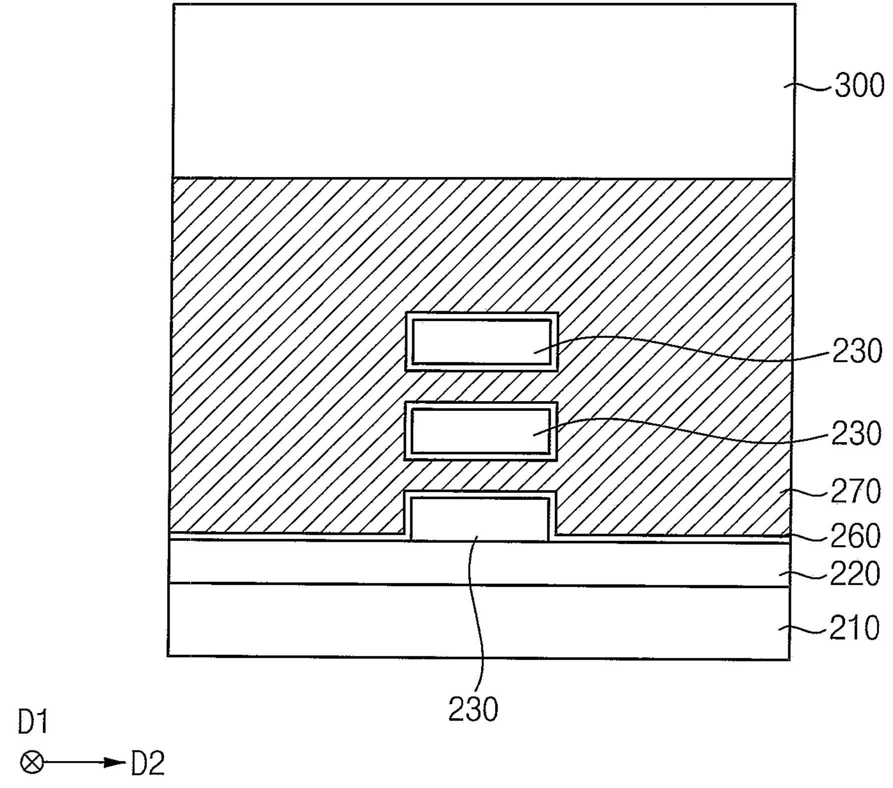

FIGS. 17 and 18 are cross-sectional views illustrating a semiconductor device in accordance with example embodiments. This semiconductor device may be an application of the planar transistor shown in FIGS. 1 and 2 to a multi-bridge channel field effect transistor (MBCFET). This semiconductor device may also be an application of the planar transistor shown in FIGS. 10 to 14 to an MBCFET.

Additionally, this semiconductor device may be substantially the same as or similar to that of FIGS. 15 and 16, except for a plurality of channel regions vertically stacked. Thus, like reference numerals refer to like elements, and repeated explanations thereof are omitted herein. Referring to FIGS. 17 and 18, the semiconductor device may include an insulating layer 220, channel regions 230, first and second contact layers 235 and 237, first and second source/drain layers 252 and 254, a gate insulating layer 260, a gate electrode 270, a gate spacer 280, first to third contact plugs 290, 292 and 294 and an insulating interlayer 300 on a substrate 210.

The gate electrode 270 and the gate insulating layer 260 may form a gate structure, and the channel regions 230 may be spaced apart from each other in a vertical direction substantially perpendicular to an upper surface of the substrate 210. The gate structure, the channel regions 230, the first and second contact layers 235 and 237, and the first and second source/drain layers 252 and 254 may form a transistor, particularly, an MBCFET.

In example embodiments, the first and second contact layers 235 and 237 may be formed at opposite sides, respectively, in the first direction D1 of each of the channel regions 230. The channel regions 230 may be spaced apart from each other in the second direction D2, and the gate structure may extend in the second direction D2 on the insulating layer 220. The gate structure may cover an upper surface and opposite sidewalls in the second direction D2 of a lowermost one of the channel regions 230, and may surround lower and upper surfaces and opposite sidewalls in the second direction D2 of other channel regions 230.

The gate spacer 280 may be formed on each of opposite sidewalls in the first direction D1 of the gate structure, and may overlap each of the first and second contact layers 235 and 237 in the vertical direction. The insulating interlayer 300 may be formed on the gate structure, the gate spacer 280 and the first and second source/drain layers 252 and 254, the first contact plug 290 may extend through the insulating interlayer 300 to contact the gate electrode 270, and the second and third contact plugs 292 and 294 may extend through the insulating interlayer 300 to contact the first and second source/drain layers 252 and 254, respectively.

The first and second contact layers 235 and 237 including a metallic 2-dimensional material may be formed between each channel region 230 including a semiconducting 2-dimensional material and the first and second source/drain layers 252 and 254, respectively, including a metal, and thus a contact resistance between each channel region 230 and each of the first and second source/drain layers 252 and 254 may decrease.

As illustrated above, in the semiconductor device in accordance with example embodiments, the contact layer including a metallic 2-dimensional material may be formed between the channel region including a semiconducting 2-dimensional material and the source/drain layer including a metal. The contact layer and the source/drain layer may be bonded with each other through a covalent bond, and thus the contact resistance between the channel region and the source/drain layer may decrease.

The inventive concept may be applied to various transistors having a channel region including a 2-dimensional material and a source/drain layer including a metal, for example, a planar transistor, a buried channel array transistor (BCAT), a finFET, an MBCFET, gate-all-around (GAA) transistor, a nano-sheet transistor, etc.

While example embodiments have been particularly shown and described, it will be understood by one of ordinary skill in the art that variations in form and detail may be made therein without departing from the spirit and scope of the claims.

What is claimed is:

1. A semiconductor device, comprising:

a channel region on a substrate, said channel region including a semiconducting 2-dimensional material;

a contact layer contacting a side of the channel region, said contact layer including a metallic 2-dimensional material, which comprises a first transition metal and a first chalcogen element bonded to the first transition metal;

a gate structure on the channel region; and a source/drain layer contacting the contact layer, said source/drain layer comprising a metal that forms a covalent bond with the first transition metal within the contact layer.

2. The semiconductor device of claim 1, wherein the contact layer further includes a transition metal dichalcogenide (TMD) layer underneath the metallic 2-dimensional material, the TMD layer containing the first transition metal and first chalcogen elements bonded to lower and upper portions of the first transition metal therein.

3. The semiconductor device of claim 2, wherein the TMD layer is one of a plurality of TMD layers that are vertically stacked on an upper surface of the substrate.

4. The semiconductor device of claim 1, wherein the contact layer further includes a transition metal dichalcogenide (TMD) layer underneath the metallic 2-dimensional material, the TMD layer containing a second transition metal and second chalcogen elements bonded to lower and upper portions of the second transition metal therein.

5. The semiconductor device of claim 1, wherein the channel region includes the first transition metal and first chalcogen elements, which are bonded to lower and upper portions of the first transition metal.

6. The semiconductor device of claim 1, wherein the contact layer includes first and second contact layers at respective first and second opposing sides of the channel region; and wherein the source/drain layer includes first and second source/drain layers on the first and second contact layers, respectively.

7. The semiconductor device of claim 1, wherein the source/drain layer contacts an upper surface of the contact layer.

8. The semiconductor device of claim 1, wherein a sidewall of the contact layer contacts the source/drain layer.

9. The semiconductor device of claim 1, wherein the channel region is one of a plurality of channel regions that are spaced apart from each other in a vertical direction orthogonal to an upper surface of the substrate; and wherein the contact layer is disposed at a side of each of the plurality of channel regions.

10. The semiconductor device of claim 9, wherein a sidewall of the contact layer contacts the source/drain layer.

* * * * *